(12) United States Patent
Fuller et al.

(10) Patent No.: US 7,198,693 B1
(45) Date of Patent: Apr. 3, 2007

(54) MICROELECTRONIC DEVICE HAVING A PLURALITY OF STACKED DIES AND METHODS FOR MANUFACTURING SUCH MICROELECTRONIC ASSEMBLIES

(75) Inventors: Jason L. Fuller, Meridian, ID (US); Shaun D Compton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 310 days.

(21) Appl. No.: 10/081,624

(22) Filed: Feb. 20, 2002

(51) Int. Cl.
*B32B 37/12* (2006.01)

(52) U.S. Cl. ......................... 156/297; 156/299; 29/832; 29/739; 29/740; 438/108; 438/109; 438/118

(58) Field of Classification Search ................ 156/297, 156/299; 29/832, 836, 739, 740; 438/108, 438/109, 118; 257/777, 778, 782, 783
See application file for complete search history.

(56) References Cited

U.S. PATENT DOCUMENTS

| 5,128,831 | A | | 7/1992 | Fox, III et al. |
| 5,252,857 | A | | 10/1993 | Kane et al. |
| 5,422,435 | A | * | 6/1995 | Takiar et al. ............... 174/52.4 |
| 5,518,957 | A | | 5/1996 | Kim |
| 5,883,426 | A | | 3/1999 | Tokuno et al. |
| 5,946,553 | A | | 8/1999 | Wood et al. |
| 5,986,209 | A | | 11/1999 | Tandy |
| 5,990,566 | A | | 11/1999 | Farnworth et al. |
| 6,020,624 | A | | 2/2000 | Wood et al. |
| 6,020,629 | A | | 2/2000 | Farnworth et al. |
| 6,028,365 | A | | 2/2000 | Akram et al. |
| 6,051,878 | A | | 4/2000 | Akram et al. |
| 6,071,371 | A | * | 6/2000 | Leonard et al. ............. 156/297 |
| 6,072,233 | A | | 6/2000 | Corisis et al. |
| 6,072,236 | A | | 6/2000 | Akram et al. |
| 6,147,411 | A | | 11/2000 | Kinsman |
| 6,175,149 | B1 | | 1/2001 | Akram |
| 6,208,525 | B1 | * | 3/2001 | Imasu et al. ................ 361/783 |
| 6,212,767 | B1 | * | 4/2001 | Tandy ........................ 29/836 |
| 6,225,689 | B1 | | 5/2001 | Moden et al. |
| 6,235,554 | B1 | | 5/2001 | Akram et al. |

(Continued)

OTHER PUBLICATIONS

Datacon Multichip Diebonder 2200 apm, 4 pages, Datacon Semiconductor Equipment GmbH, Radfeld/Tirol, Austria, <http://www.datacon.at>.

*Primary Examiner*—Jessica Rossi
(74) *Attorney, Agent, or Firm*—Perkins Coie LLP (57) ABSTRACT

Systems and methods for assembling microelectronic devices that have a base die and a conventional wire-bond die stacked on the base die. In one embodiment of a method in accordance with the invention, a base die is placed on a substrate and then a first stacked die is subsequently stacked on the base die. The first stacked die is stacked on the base die in a single pass through a die attach machine without first storing or otherwise processing the base die/substrate assembly in a separate machine. The stacked die, moreover, can be stacked onto the base die before heating the base die to reflow a solder or otherwise attach the base die to the substrate. After stacking the first stacked die on the base die, the complete die assembly can be heated to (a) secure the base die to the substrate, and (b) secure the first stacked die to the base die.

12 Claims, 5 Drawing Sheets

U.S. PATENT DOCUMENTS

| | | |
|---|---|---|
| 6,258,623 B1 | 7/2001 | Moden et al. |
| 6,281,577 B1 | 8/2001 | Oppermann et al. |
| 6,294,839 B1 | 9/2001 | Mess et al. |
| 6,297,547 B1 | 10/2001 | Akram |
| 6,303,981 B1 | 10/2001 | Moden |
| 6,378,200 B1 * | 4/2002 | Lim et al. ............ 29/832 |
| 6,552,910 B1 | 4/2003 | Moon et al. |
| 6,560,117 B2 | 5/2003 | Moon |
| 2003/0145939 A1 * | 8/2003 | Ahn et al. ............ 156/235 |

* cited by examiner

MICROELECTRONIC DEVICE HAVING A PLURALITY OF STACKED DIES AND METHODS FOR MANUFACTURING SUCH MICROELECTRONIC ASSEMBLIES

TECHNICAL FIELD

The following is related to microelectronic devices having a plurality of dies in which a first die is attached to a substrate and a second die is stacked on the first die.

BACKGROUND

Microelectronic devices generally have a die (i.e., a chip) that includes integrated circuitry having a high density of very small components. In a typical process, a large number of dies are manufactured on a single wafer using many different processes that may be repeated at various stages (e.g., implanting, doping, photolithography, chemical vapor deposition, plasma vapor deposition, plating, planarizing, etching, etc.). The dies typically include an array of very small bond-pads electrically coupled to the integrated circuitry. The bond-pads are the external electrical contacts on the die through which the supply voltage, signals, etc., are transmitted to and from the integrated circuitry. The dies are then separated from one another (i.e., singulated) by cutting the wafer and backgrinding the individual dies. After the dies have been singulated, they are typically "packaged" to couple the bond-pads to a larger array of electrical terminals that can be more easily coupled to the various power supply lines, signal lines and ground lines.

The individual dies can be packaged by electrically coupling the bond-pads on the die to arrays of pins, ball-pads, or other types of electrical terminals, and then encapsulating the die to protect it from environmental factors (e.g., moisture, particulates, static electricity and physical impact). In one application, the bond-pads are coupled to leads of a lead frame, and then the die and a portion of the lead frame is encapsulated in a protective plastic or other material. In other applications for packaging high density components in smaller spaces, the bond-pads are electrically connected to contacts on a thin substrate that has an array of ball-pads. For example, one such application known as "flip-chip" packaging involves placing the active side of the die having the bond-pads downward against the contacts on a ball-grid array substrate, reflowing solder between the contacts and the bond-pads, and then molding an encapsulant around the die without covering the ball-pads on the ball-grid array. Other types of packing that use ball-grid arrays include "chip-on-board," "board-on-chip," and "flex-on-chip" devices. These types of devices are generally known as Ball-Grid-Array (BGA) packages.

Many electrical products require packaged microelectronic devices to have an extremely high density of components in a very limited amount of space. The space available for memory devices, processors, displays and other microelectronic components is quite limited in cell phones, personal digital assistants, portable computers and many other products. As such, there is a strong drive to reduce the "footprint" and/or the height of packaged microelectronic devices. This is becoming difficult because high performance devices generally have more bond-pads, which result in larger ball-grid arrays and thus larger footprints. Thus, there is a strong need to reduce the size of BGA packaged devices.

One technique to increase the density of microelectronic devices within a footprint on a printed circuit board is to stack one microelectronic die on top of another. It will be appreciated that stacking the dies increases the density of microelectronic devices within a given footprint. The microelectronic dies are typically stacked on each other in a two-pass process starting with a first pass that mounts a flip-chip die to a substrate and a second pass that mounts a conventional wire-bond die onto the backside of the flip-chip die. The first pass typically involves mounting the flip-chip die to the substrate in a first die attach machine, and then heating the flip-chip/substrate subassembly to reflow solder bumps. The heating process securely attaches the flip-chip to the substrate. After mounting the flip-chip to the substrate, the flip-chip/substrate subassembly is transported to a second die attach machine where it is held for processing in a second-pass. The second pass through the second die attach machine involves (a) dispensing epoxy onto the backside of the flip-chip, and (b) mounting a conventional wire-bond chip to the epoxy. The stacked die assembly is then re-heated to cure the epoxy after the second pass through the second die attach machine.

The conventional two-pass processes for stacking a conventional wire-bond die onto the backside of a flip-chip die typically occur in two different die attach machines. It will be appreciated that a single die attach machine may be used instead by mounting the flip-chip die to the substrate in a first pass, heating the mounted flip-chip in a first heating cycle to reflow solder on the flip-chip die, reprogramming the die attach machine to attach the wire-bond dies to the backside of the mounted flip-chip dies in a separate second-pass through the machine, attaching the wire-bond die to an epoxy on the flip-chip die in a second pass through the same die attach machine, reheating the stacked die assembly, and then reprogramming the die attach machine again to mount flip-chip dies to another set of substrates in a new first pass.

One problem associated with a two-pass procedure for stacking dies is that it inefficiently handles the dies and reduces the throughput of packaged devices. A two-pass system inherently requires a large number of substrates and flip-chip dies to be maintained at the front end of the first-pass die attach machine and a large inventory of flip-chip/substrate subassemblies to be held at the second-pass die attach machine. It will be appreciated that a large number of components are held at various stages of conventional stacking processes, which reduces the efficiency of these processes. Therefore, the conventional two-pass procedures for assembling stacked microelectronic dies are inefficient and reduce the throughput of finished products.

Another problem of two-pass die attach procedures is that they are expensive to implement and operate. For example, in applications that use different die attach machines for the first and second passes, a number of machines are accordingly dedicated to each individual operation and a large number of operators are required to run and monitor the individual machines. It will be appreciated that a significant amount of capital is required for purchasing the machines and building the clean facilities for housing these machines. Moreover, the continuing operating costs for the personnel to operate such a large number of different machines can also be quite high. The two-pass procedures that run two separate passes through a single machine are also expensive because they require a significant amount of down time to reprogram the machine to switch back and forth from processing flip-chip dies to processing conventional wire-bond dies. The significant down time also reduces the throughput and increases the operating cost of using a single die attach machine for performing conventional two-pass procedures.

Although it is desirable to stack dies on each other to form high density microelectronic devices, conventional procedures for stacking the dies on each other are inefficient and costly. Therefore, it would be desirable to develop a more efficient system and method for stacking microelectronic dies in the fabrication of high density microelectronic devices.

DETAILED DESCRIPTION

The following disclosure sets forth several embodiments of systems and methods for assembling microelectronic devices that have a base die and a conventional wire-bond die stacked on the base die. In one embodiment of a method in accordance with the invention, a base die is placed on a substrate and then a first stacked die is subsequently stacked on the base die. The first stacked die is stacked on the base die in a single pass through a die attach machine without first storing or otherwise processing the base die/substrate assembly in a separate machine. The stacked die, moreover, can be stacked onto the base die before heating the base die to reflow a solder or otherwise attach the base die to the substrate. After stacking the first stacked die on the base die, the complete die assembly can be heated to (a) secure the base die to the substrate, and (b) secure the first stacked die to the base die.

Several embodiments of methods in accordance with the invention accordingly make stacked die assemblies in a single pass through a single die attach machine without having to store large numbers of the base die/substrate subassemblies at separate machines for mounting the stacked die onto the base die. This reduces (a) the number of die attach machines that are required for forming stacked die assemblies, (b) the personnel for operating different types of machines, and/or (c) the inventory that is held up in the manufacturing process. Therefore, as explained in more detail below with reference to FIGS. 1–5E, several aspects of methods and systems in accordance with particular embodiments of the invention are expected to provide more efficient, cost effective fabrication of stacked microelectronic die assemblies.

Figure 1:
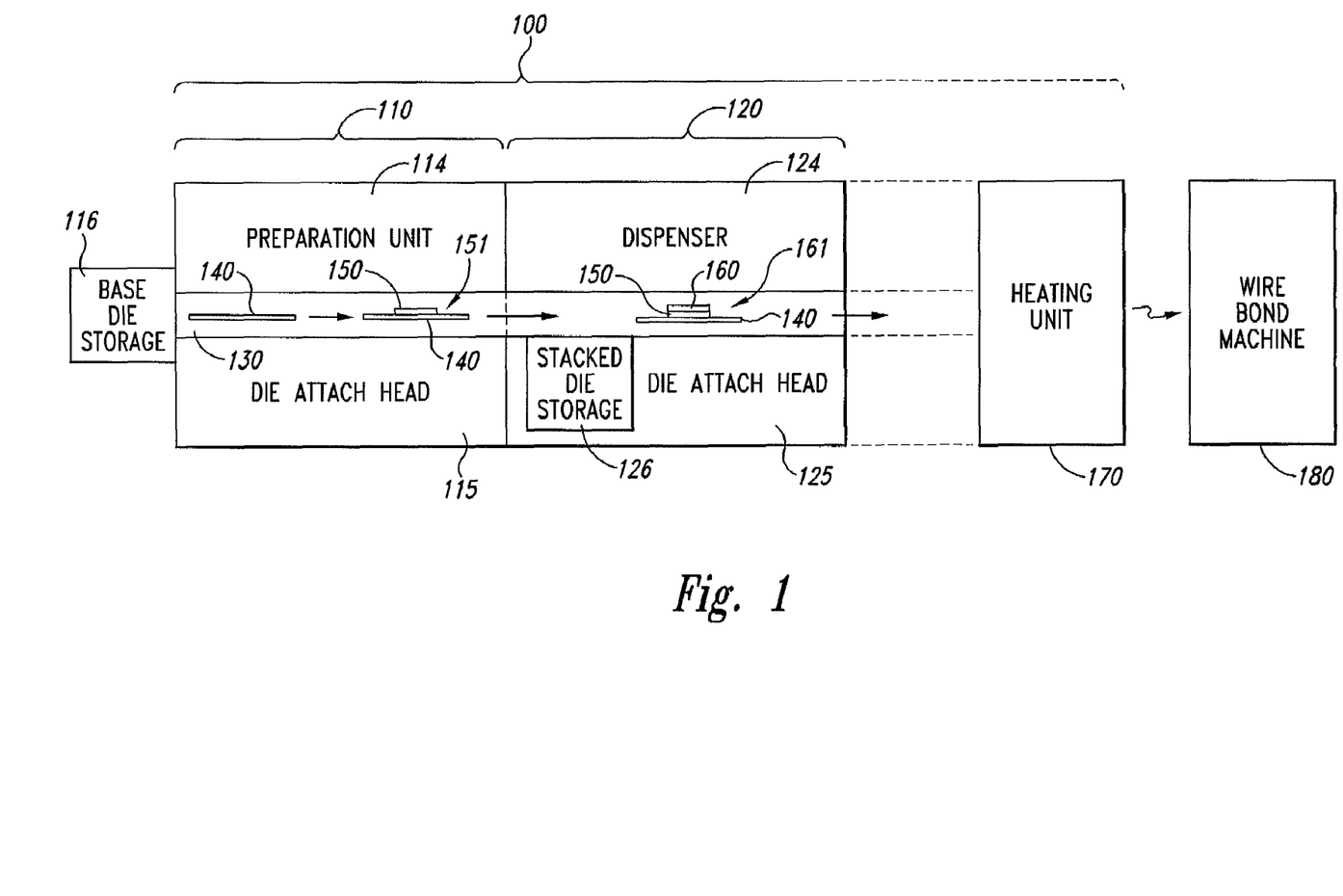
FIG. 1 is a schematic view of a single pass system for fabricating a stacked die assembly in accordance with an embodiment of the invention.

FIG. 1 is a schematic view of a system for assembling a stacked die assembly in a single pass through a single die attach machine. The system includes a die attach machine 100 that has a first die attach station 110, a second die attach station 120, and a transfer mechanism 130 that services the first and second die attach stations 110 and 120. The first and second die attach stations can be configured to mount different types of dies in a stacked configuration. In the embodiment shown in FIG. 1, the second die attach station 120 is immediately downstream from the first die attach station 110. A partially assembled microelectronic device can thus pass directly from the first die attach station 110 to the second die attach station 120 to be processed in a single pass without being held in a queue at a separate die attach machine.

The first die attach station 110 can include a preparation unit 114, a first head 115, and a base die storage unit 116. The preparation unit 114 is an optional feature of the first die attach station that disposes a preparation material onto either a substrate or the base die. The preparation unit 114, for example, can deposit an underfill material onto the substrate, a flux material onto the base die, or a combination of underfill and flux materials. The first head 115 receives a base die from either the base die storage unit 116 or the preparation unit 114 and then places the base die onto a substrate.

The second die attach station 120 includes a dispenser 124, a second head 125, and a stacked die storage unit 126. The dispenser 124 dispenses an adhesive for attaching the stacked dies onto the base dies. The dispenser 124, for example, can deposit an epoxy or another type of adhesive compound onto a backside of a base die that was mounted to a substrate in the first die attach station 110. As with the first die attach station 110, the second die attach station can also deposit an underfill material, a flux material, or a combination of these materials. The second head 125 receives a first stacked die from the stacked die storage unit 126 and then stacks it on the backside of the base die.

Several embodiments of the die attach machine 110 assemble a stacked die assembly having a substrate, a base die on the substrate, and a first stacked die on the base die in a single pass through a single die attach machine without a heating cycle before stacking the stacked die onto the base die. Referring to FIG. 1, the transfer mechanism 130 carries a blank substrate 140 through the first die attach station 110. The first head 115 places a base die 150 onto the substrate 140, and then the transfer mechanism 130 carries a subassembly 151 of the substrate 140 and the base die 150 directly to the second die attach station 120 without storing the subassembly 151 in a separate storage area. The second head 125 places a first stacked die 160 onto the backside of the base die 150 to form a stack die assembly 161. The stacking of the first stacked die 160 onto the base die 150 in the second head 125 can occur before the subassembly 151 is heated.

Several embodiments of the process for assembling the stacked die assembly 161 continue by heating the assembly of the substrate 140, the base die 150, and the first stacked die 160 in a heating unit 170. The heating stage cures the adhesive that attaches the first stacked die 160 to the base die 150. The heating stage can also reflow a solder or cure an adhesive between the base die 150 and the substrate 140 to securely and permanently adhere the base die 150 to the substrate 140. After the heating stage, the stacked die assembly can be processed in a wire bonding machine that forms wire bonds between contact pads on the first stacked die 160 and contact pads on the substrate 140. The wire bonds accordingly electrically couple the circuitry in the first stacked die 160 to appropriate contact pads or pins on the substrate 140.

The heating unit 170 can be a component of the die attach machine 100 (shown in dashed lines). In this embodiment, the transfer mechanism 130 transfers the stacked die assemblies directly from the second die attach station 120 to the heating unit 170. In an alternate embodiment, the heating unit 170 can be a separate unit such that stacked die assemblies 161 are loaded into containers or other devices and moved from the second die attach station 120 to a separate heating unit. As explained in more detail below, the dual-die, single pass die attach machine 100 is expected to be useful for assembling stacked die assemblies having a base die comprising a flip-chip die or a board-on-chip die, and a first stacked die comprising a conventional wire-bond die.

Figure 2A:
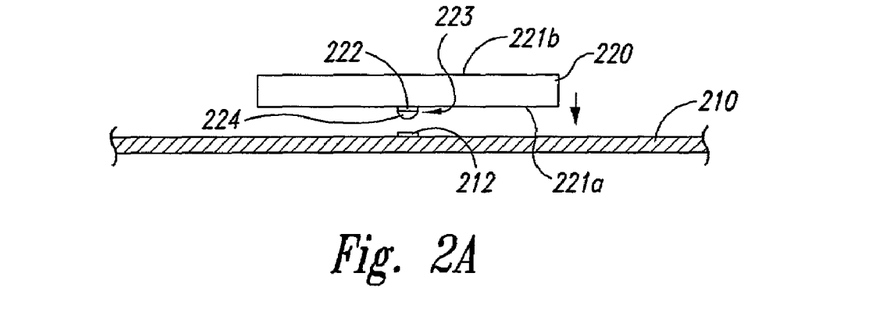
FIGS. 2A–2D are cross-sectional views illustrating various stages of a method for assembling microelectronic devices having stacked die assemblies in accordance with an embodiment of the invention.

FIGS. 2A–2D are schematic cross-sectional views of progressive stages of assembling a stacked die assembly in accordance with one embodiment of the invention. FIG. 2A illustrates an initial stage that occurs in the first die attach station 110 (FIG. 1) in which a substrate 210 with a plurality of contacts 212 is being populated with one or more base dies 220. For example, the base die 220 can be a flip-chip die having a front side 221a, a backside 221b, and a plurality of bond-pads 223 along the front side 221a. The bond-pads 223 are areas for electrical connections that can include a pad 222 and a preparation material 224 disposed on the pads 222 of the flip-chip die 220. The preparation material 224, for example, can be a flux or a solder paste that is disposed onto the pads 222. When the preparation material is a flux, it can be deposited onto the flip-chip die 220 in a flux dip operation performed in the first die attach station 110. In an alternate embodiment, the preparation material 224 can be an underfill material that is deposited onto the substrate 210 before introducing the substrate 210 to the first die attach station 110 and/or in the first die attach station 110. In still another embodiment, solder bumps can be placed on the bond-pads 223 in a fab process before entering the first die attach station 110.

Figure 2B:
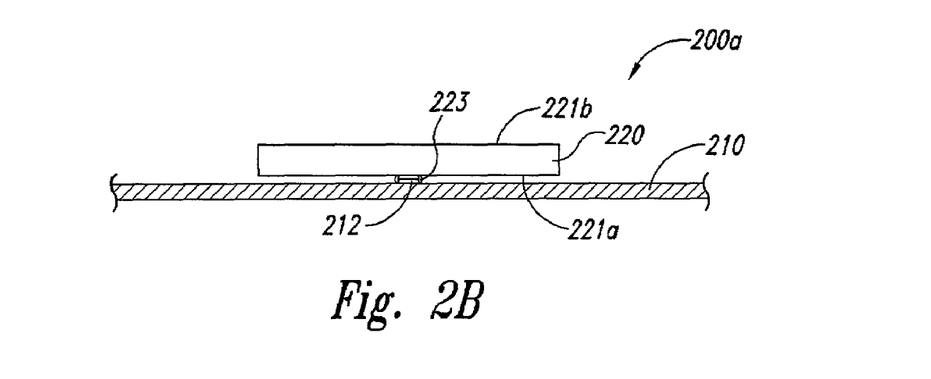

FIG. 2B illustrates a subassembly 200a including the base die 220 and the substrate 210. More specifically, the first head 115 places the base die 220 onto the substrate 210 so that the front side 221a of the base die 220 and the bond-pads 223 face towards the substrate 210. The transfer mechanism 130 (FIG. 1) then transfers the subassembly 200a directly to the second die attach station 120 (FIG. 1) without removing the subassembly 220a from the die attach machine 100.

Figure 2C:
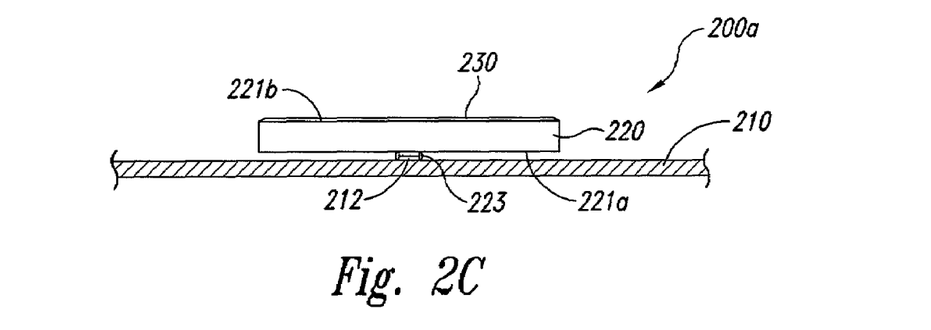

FIG. 2C illustrates the subassembly 200a in the second die attach station 120 (FIG. 1) after an adhesive 230 has been deposited onto the backside 221b of the flip-chip die 220. For example, the dispenser 124 of the second die attach station 120 can deposit an epoxy onto the backside 221b of the flip-chip die 220. The subassembly 200a is now ready for stacking another die on the flip-chip die 220.

Figure 2D:
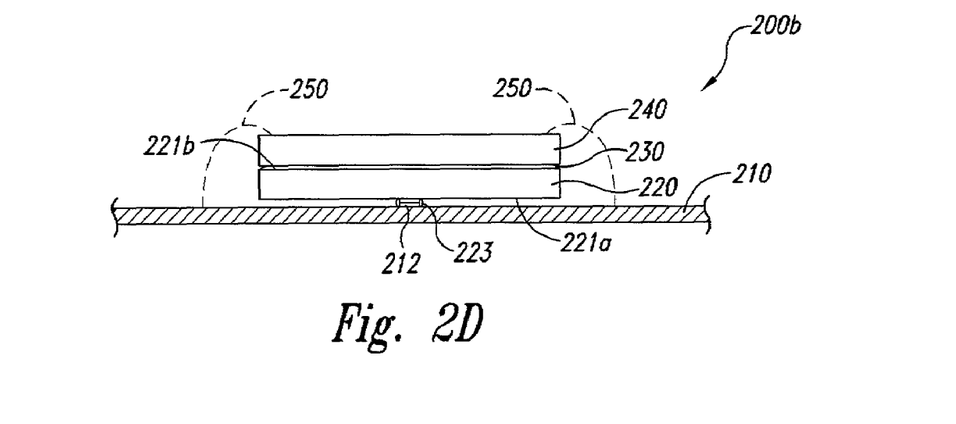

FIG. 2D illustrates an embodiment of a stacked die assembly 200b including a conventional wire-bond die 240 stacked onto the backside 221b of the flip-chip die 220. In this particular embodiment, the second head 125 stacks the wire-bond die 240 onto the backside 221b of the flip-chip die 220 before heating the subassembly 200a. After stacking the wire-bond die 240 onto the flip-chip die 220, the stacked die assembly 200b is then heated in the heating unit 170 (FIG. 1) to (a) cure the preparation material 224 for securely attaching the flip-chip die 220 to the substrate 210, and (b) cure the adhesive 230 for securely attaching the wire-bond die 240 to the flip-chip die 220. For example, when the preparation material 224 is solder, the heating unit 170 simultaneously reflows the solder and cures the adhesive 230 in a single heating procedure. In an alternate embodiment in which the preparation material 224 is an underfill material or an epoxy, the heating unit 170 simultaneously cures the preparation material 224 and the adhesive 230. A plurality of wire-bond lines 250 (shown in phantom) can subsequently be attached to the wire-bond die 240 and the substrate 210 in a separate wire-bond machine 180 (FIG. 1).

Figure 3A:
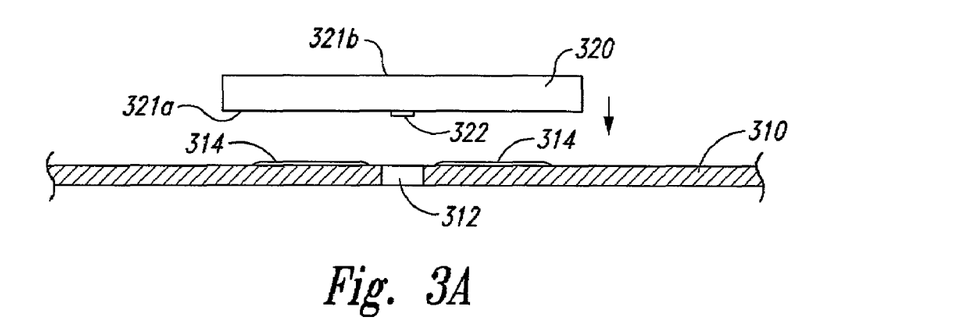
FIGS. 3A–3D are cross-sectional views illustrating various stages of a method for assembling microelectronic devices having stacked die assemblies in accordance with another embodiment of the invention.
Figure 3B:
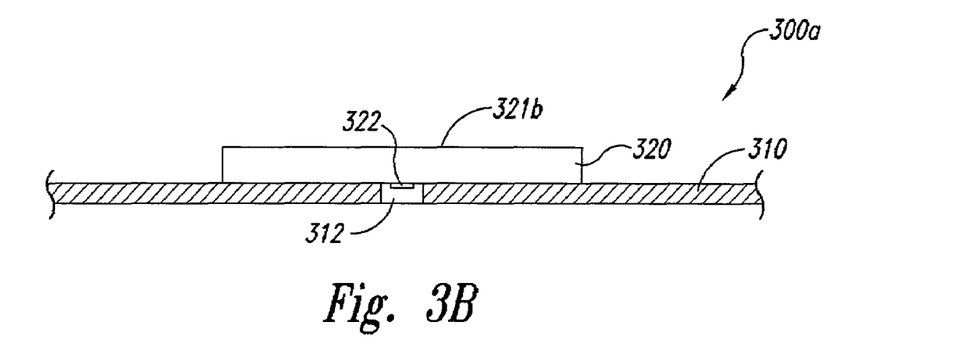

FIGS. 3A–3D are cross-sectional schematic views illustrating progressive stages of another embodiment of the method in accordance with the present invention. FIG. 3A illustrates a board-on-chip substrate 310 having a slot 312 and a preparation material 314 onto the substrate 310. The preparation material 314, for example, can be a tape, an epoxy, or another type of adhesive. FIG. 3A also illustrates a board-on-chip die 320 having a front side 321a, a backside 321b, and a plurality of bond-pads 322 on the front side 321a. In operation, the transfer mechanism 130 (FIG. 1) carries the substrate 310 to the first head 115 in the first die attach station 110. Referring to FIG. 3B, the first head 115 places the board-on-chip die 320 onto the substrate 310 to form a subassembly 300a in which the bond-pads 322 of the board-on-chip die 320 are aligned with the slot 312 in the substrate 310. The transfer mechanism 130 then carries the subassembly 300a directly to the second die attach station 120 (FIG. 1).

Figure 3C:
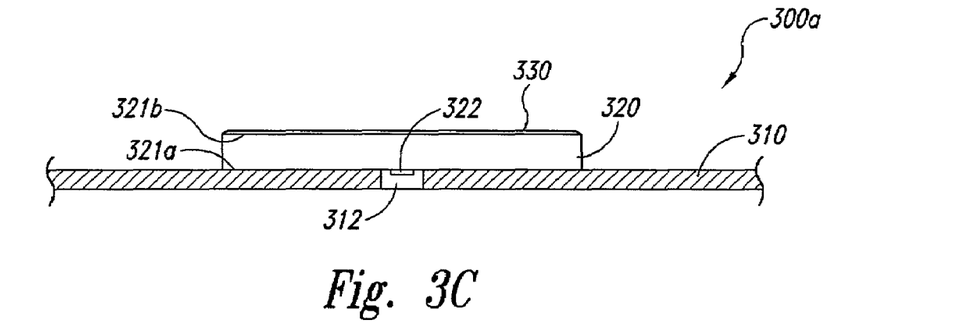
Figure 3D:
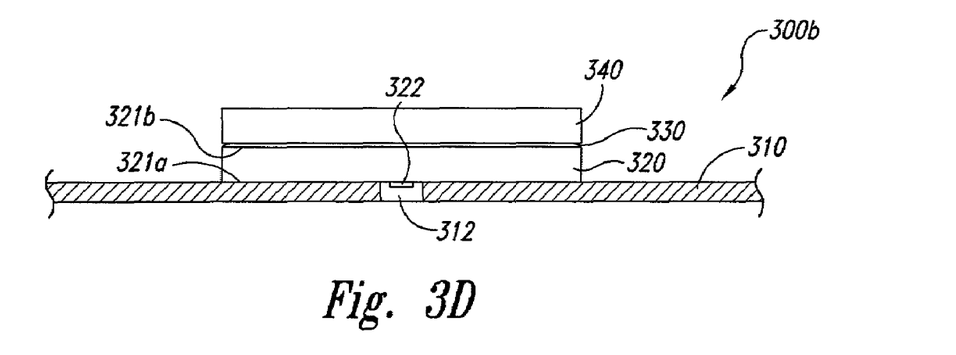

FIG. 3C illustrates the subassembly 300a when it is in the second die attach station 120. At this stage, the dispenser 124 (FIG. 1) deposits an adhesive 330 onto the backside 321b of the board-on-chip die 320. The second head 125 then places a conventional wire-bond die 340 onto the backside 321b of the board-on-chip die 320 in a manner similar to the foregoing description regarding FIG. 2D.

Several embodiments of the methods and systems for manufacturing stacked die assemblies described above increase the throughput and provide a more efficient use of parts because the single pass procedure eliminates many of the pitfalls of conventional two-pass processes. In the single pass procedure, for example, the inventory of components is not tied up at a separate machine for stacking the top dies onto the base dies. Several embodiments of the inventive methods and systems pass the subassembly with the substrate and the base die directly from the first die attach station 110 to the second die attach station 120. The substrates accordingly remain on a single transfer mechanism between the first and second die attach stations 110 and 120. It will be appreciated that this eliminates the processing time that is typically lost in transporting and storing subassemblies of base dies and substrates between the separate die attach machines of conventional two-pass procedures.

Several embodiments of the systems and methods for fabricating stacked die assemblies are also expected to increase the throughput because they reduce the number of heating stages compared to two-pass procedures. As set forth above, many of the embodiments of the methods cure the solders, fluxes, and/or adhesive materials in a single heating cycle after stacking the first stacked die onto the base die. Using only a single heating stage is counter intuitive to the prior teachings of the art that generally disclose it is necessary to heat the subassembly of the base die and the substrate before moving or otherwise handling the subassembly to avoid displacing the base die. The present inventors have discovered that any displacement between the base die and the substrate through the first and second die attach stations 110 and 120 of the single pass die attach machine 100 is within acceptable tolerances; the base die/substrate subassembly, therefore, does not need to be heated before stacking the first stacked die onto the base die. This is further expected to enhance the throughput of fabricating stacked die assemblies because an entire heating stage can be eliminated.

Another aspect of several embodiments of the methods and systems for fabricating stacked die assemblies is that they are expected to reduce the number of machines and operators. By assembling the base die to the substrate and stacking the first stacked die onto the base die in a single pass through a single die attach machine, it will be appreciated that a number of additional die attach machines and transport mechanisms are eliminated. This will accordingly reduce the capital expenditures and the operating expenditures to fabricate stacked die assemblies.

Figure 4:
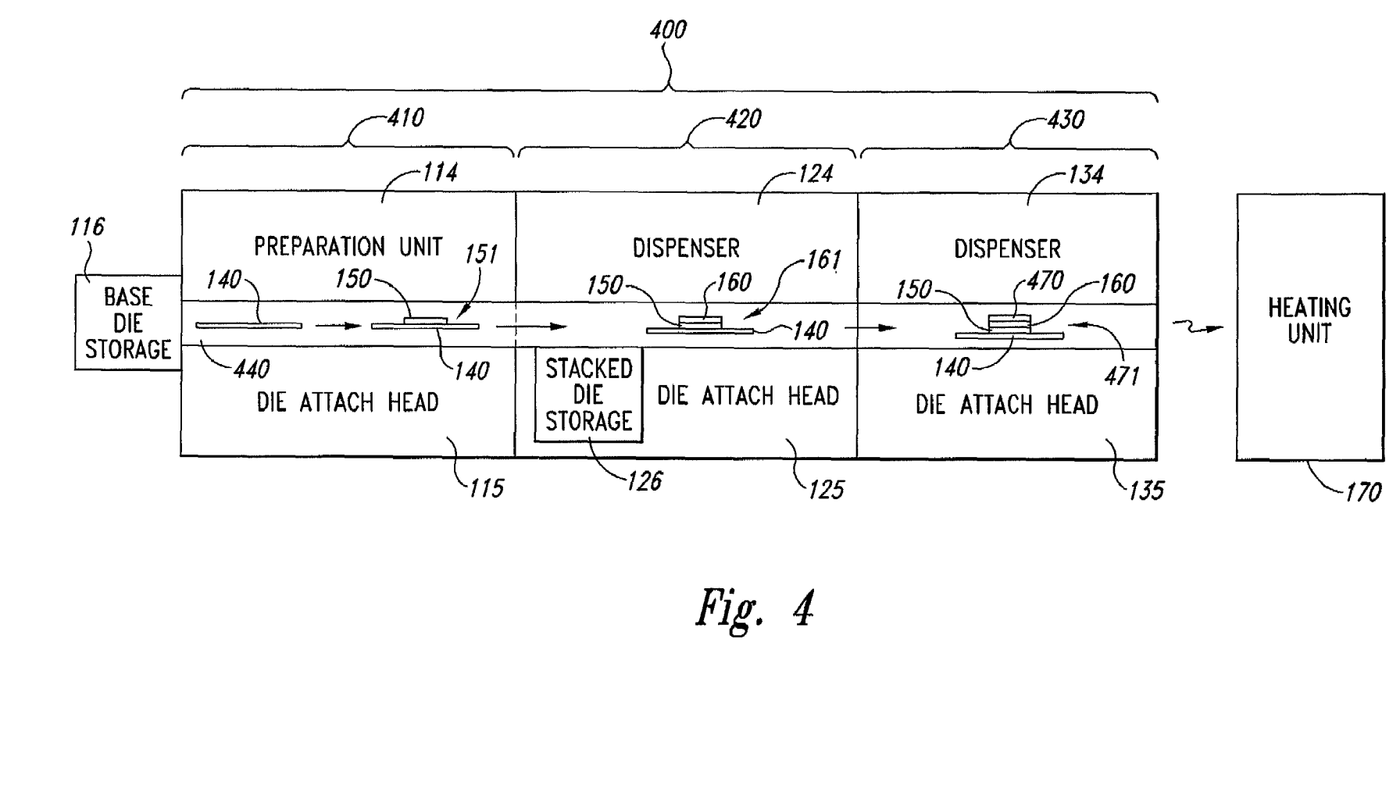
FIG. 4 is a schematic view illustrating a single pass system for fabricating a stacked die assembly in accordance with another embodiment of the invention.

FIG. 4 is a schematic view of a system for assembling a triple stacked die assembly in a single pass through a single die attach machine. The system includes a die attach machine 400 that has a first die attach station 410, a second die attach station 420, a third die attach station 430, and a transfer mechanism 440 that services the die attach stations 410, 420 and 430. The first and second die attach stations 410 and 420 can be the same as the first and second die attach stations 110 and 120 described above with reference to FIG. 1. As such, like reference numbers refer to like components in FIGS. 1–4. The third die attach station 430 can be similar to the second die attach station 420. The third die attach station 430 can accordingly include a dispenser for dispensing an adhesive and a second head 135 for stacking a second stacked die onto the first stacked die.

In operation, the transfer mechanism 440 moves the stacked die assembly 161 from the second die attach station 420 directly to the third die attach station 430. A dispenser 134 deposits an adhesive onto the exposed side of the first stacked die 160, and then the third die attach head 135 stacks a second stacked die 470 onto the first stacked die 160. The assembly of the substrate 140, the base die 150, the first stacked die 160, and the second stacked die 470 accordingly define another stacked die assembly 471. The stacked die assembly 471 can then be transferred to a heating unit 170 to cure all of the adhesives between the various dies and/or reflow solder or flux materials.

Figure 5A:
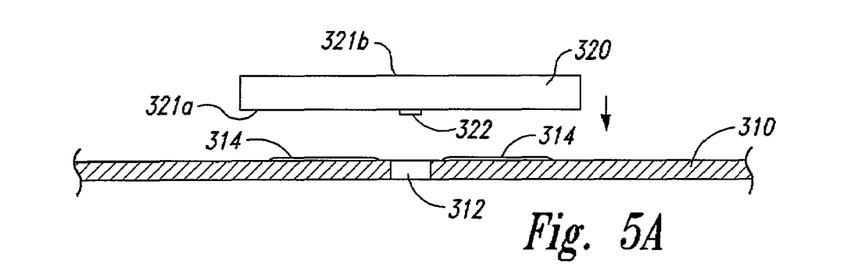
FIGS. 5A–5E are cross-sectional views illustrating various stages of a method for assembling microelectronic devices having stacked die assemblies in accordance with yet another embodiment of the invention.
Figure 5B:
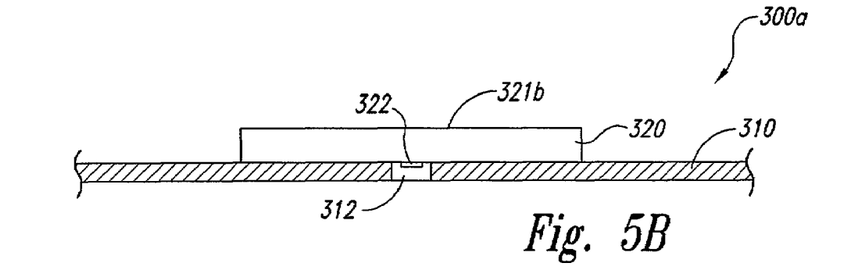
Figure 5C:
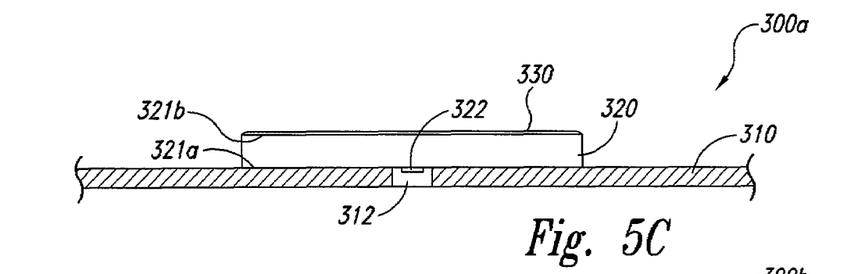
Figure 5D:
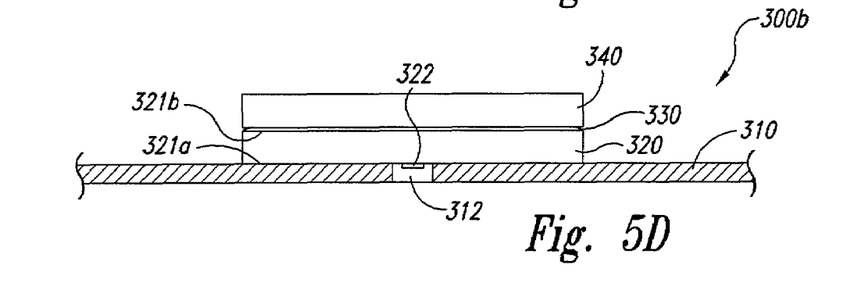
Figure 5E:
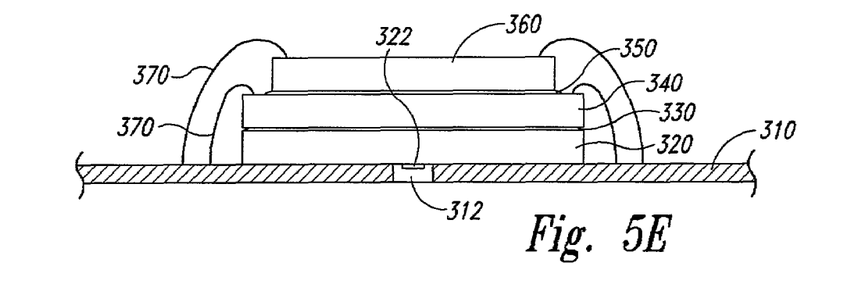

FIGS. 5A–5E are schematic cross-sectional views of progressive stages of assembling a triple stacked die assembly in accordance with yet another embodiment of the invention. FIGS. 5A–5D illustrate stages of fabricating a triple stacked die assembly 300b including a substrate 310, a base die 320, and a first stacked die 340 in accordance with the procedure described above with reference to FIGS. 3A–3D. Referring to FIG. 5E, another die can be stacked on the first stacked die 340 in the third die attach station 430 (FIG. 4) by depositing an adhesive 350 onto an exposed surface of the first stacked die 340 and then mounting a second stacked die 360 onto the first stacked die 340. The first and second stacked dies 340 and 360 can be conventional dies that are electrically coupled to the substrate 310 by a plurality of wire-bonds 370. It will be appreciated that additional dies can be stacked onto the second stacked die 360 to form stacked die assemblies having even more dies. It is expected that the die attach machine 400 and the method for forming a stacked die assembly having three or more dies will have the same benefits as described above with reference to FIGS. 1–3D.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method for assembling microelectronic dies, comprising:
    placing a base die on a substrate in a die attach machine so that a front side of the base die with bond pads faces toward the substrate and a backside of the base die faces away from the substrate; and
    stacking a first stacked die onto the backside of the base die in the same die attach machine by dispensing an adhesive onto the backside of the base die and placing a backside of the first stacked die onto the adhesive, wherein the first stacked die is stacked onto the base die before securing the base die to the substrate in a heating cycle.

2. The method of claim 1, further comprising heating the base die and the first stacked die in a single heating cycle to secure the base die to the substrate and to secure the first stacked die to the base die.

3. The method of claim 1 wherein placing the base die and stacking the first stacked die occur without loading the substrate and the base die into a separate die attach machine.

4. The method of claim 1, further comprising placing the base die on the substrate and stacking the first stacked die onto the base die in a single pass through a single die attach machine.

5. The method of claim 1 wherein placing the base die on the substrate comprises positioning a flip chip on the substrate.

6. The method of claim 1 wherein dispensing the adhesive onto the backside of the base die comprises depositing an epoxy onto the base die.

7. A method for assembling microelectronic dies, comprising:
    preparing a substrate to receive a base die in a die attach machine;
    placing the base die on the substrate in the die attach machine so that a front side of the base die with bond pads faces toward the substrate and a backside of the base die faces away from the substrate;
    moving the base die within the same die attach machine without heating the base die; and
    stacking a first stacked die onto the base die in the die attach machine by dispensing an adhesive onto the backside of the base die and placing the first stacked die onto the adhesive.

8. The method of claim 7, further comprising heating the base die and the first stacked die in a single heating cycle to secure the base die to the substrate and to secure the first stacked die to the base die.

9. The method of claim 7 wherein placing the base die and stacking the first stacked die occur without loading the substrate and the base die into a separate die attach machine.

10. The method of claim 7 wherein placing the base die on the substrate and stacking the first stacked die onto the base die occur in a single pass through the die attach machine.

11. The method of claim 7 wherein placing the base die on the substrate comprises positioning a flip chip on the substrate.

12. The method of claim 7 wherein dispensing the adhesive onto the backside of the base die comprises depositing an epoxy onto the base die.

* * * * *